United States Patent
Aksyuk et al.

(10) Patent No.: US 12,188,969 B2
(45) Date of Patent: Jan. 7, 2025

(54) PHOTONIC RYDBERG ATOM RADIO FREQUENCY RECEIVER AND MEASURING A RADIO FREQUENCY ELECTRIC FIELD

(71) Applicant: Government of the United States of America, as represented by the Secretary of Commerce, Gaithersburg, MD (US)

(72) Inventors: Vladimir Anatolyevich Aksyuk, Gaithersburg, MD (US); Christopher Lee Holloway, Boulder, CO (US); Matthew Thomas Simons, Lafayette, CO (US); Alexandra Brea Artusio-Glimpse, Boulder, CO (US)

(73) Assignee: GOVERNMENT OF THE UNITED STATES OF AMERICA, AS REPRESENTED BY THE SECRETARY OF COMMERCE, Gaithersburg, MD (US)

( * ) Notice: Subject to any disclaimer, the term of this patent is extended or adjusted under 35 U.S.C. 154(b) by 232 days.

(21) Appl. No.: 17/879,704

(22) Filed: Aug. 2, 2022

(65) Prior Publication Data
US 2022/0390496 A1 Dec. 8, 2022

Related U.S. Application Data

(63) Continuation-in-part of application No. 16/818,330, filed on Mar. 13, 2020, now Pat. No. 11,435,386.
(Continued)

(51) Int. Cl.
| | |
|---|---|
| *G01R 29/08* | (2006.01) |
| *G01R 33/02* | (2006.01) |
| *H04B 10/70* | (2013.01) |

(52) U.S. Cl.
CPC ..... *G01R 29/0885* (2013.01); *G01R 29/0892* (2013.01); *H04B 10/70* (2013.01); *G01R 33/02* (2013.01)

(58) Field of Classification Search
CPC ............ G01R 29/0885; G01R 29/0892; G01R 33/02; G01R 33/0029; G01R 33/0094;
(Continued)

(56) References Cited

U.S. PATENT DOCUMENTS

| | | |
|---|---|---|
| 10,509,065 B1 | 12/2019 | Shaffer |
| 10,605,840 B1 | 3/2020 | Amarloo et al. |

(Continued)

OTHER PUBLICATIONS

Hummon, Matthew T., et al. "Photonic chip for laser stabilization to an atomic vapor with 10- 11 instability." Optica 5.4 (2018): 443-449. (Year: 2018).*
(Continued)

*Primary Examiner* — Christopher P McAndrew
(74) *Attorney, Agent, or Firm* — Office of Chief Counsel for National Institute of Standards and Technology

(57) ABSTRACT

A photonic Rydberg atom radio frequency receiver includes: an integrated photonic chip; an atomic vapor cell; and a receiver member including: a photonic emitter; probe light reflectors disposed on the atomic vapor cell; and coupling light reflectors disposed on the atomic vapor cell such that the pair of coupling light reflectors is optically opposed across the interior vapor space and receives and reflects the coupling laser light so that the coupling laser light is reflected between the coupling light reflectors multiple times in the interior vapor space of the atomic vapor cell.

18 Claims, 14 Drawing Sheets

Related U.S. Application Data

(60) Provisional application No. 63/228,238, filed on Aug. 2, 2021, provisional application No. 62/819,232, filed on Mar. 15, 2019.

(58) Field of Classification Search
CPC .............. G01R 33/032; G01R 29/0878; H04B 10/70
USPC .......................................................... 324/96
See application file for complete search history.

(56) References Cited

U.S. PATENT DOCUMENTS

| | | |
|---|---|---|
| 10,979,147 B2 | 4/2021 | Gordon et al. |
| 11,150,285 B2 | 10/2021 | Amarloo et al. |
| 11,165,505 B2 | 11/2021 | Gordon et al. |
| 11,366,430 B2 | 6/2022 | Ramirez-Serrano et al. |
| 2019/0187198 A1* | 6/2019 | Anderson .......... G01R 29/0878 |
| 2019/0339586 A1* | 11/2019 | Lam .................. H01S 3/094096 |
| 2020/0292606 A1 | 9/2020 | Holloway et al. |
| 2021/0114926 A1 | 4/2021 | Ramirez-Serrano et al. |
| 2022/0018914 A1 | 1/2022 | Holloway et al. |

OTHER PUBLICATIONS

Fan, Haoquan, et al. "Atom based RF electric field sensing." Journal of Physics B: Atomic, Molecular and Optical Physics 48.20 (2015): 202001. (Year: 2015).*

Kim, S. et al., "Photonic waveguide to free-space Gaussian beam extreme mode converter", Light: Science & Applications, 2018, p. 1-13, vol. 7 No. 72.

Hummon, M.T., et al., "Photonic chip for laser stabilization to an atomic vapor with 10-11 instability", Optica, 2018, p. 443-449, vol. 5 No. 4.

* cited by examiner (A) 200

(B) 200

(C) 200

8

PHOTONIC RYDBERG ATOM RADIO FREQUENCY RECEIVER AND MEASURING A RADIO FREQUENCY ELECTRIC FIELD

CROSS REFERENCE TO RELATED APPLICATIONS

This application claims the benefit of U.S. Provisional Patent Application Ser. No. 63/228,238 (filed Aug. 2, 2021), which is herein incorporated by reference in its entirety. This application is a continuation-in-part and claims benefit of U.S. patent application Ser. No. 16/818,330 (filed Mar. 13, 2020), which claims the benefit of U.S. Provisional Patent Application Ser. No. 62/819,232 (filed Mar. 15, 2019), both of which are herein incorporated by reference in their entirety.

STATEMENT REGARDING FEDERALLY SPONSORED RESEARCH

This invention was made with United States Government support from the National Institute of Standards and Technology (NIST), an agency of the United States Department of Commerce. The Government has certain rights in this invention.

BRIEF DESCRIPTION

Disclosed is a photonic Rydberg atom radio frequency receiver for measuring a radio frequency electric field of a radio frequency field, the photonic Rydberg atom radio frequency receiver comprising: an integrated photonic chip; at least one atomic vapor cell hermetically disposed on the integrated photonic chip and that receives an atomic vapor and that comprises a cell wall that bounds an interior vapor space, such that the atomic vapor is disposed in the interior vapor space and that: receives the probe laser light from the photonic emitter and coupling laser light, such that probe laser light and the coupling laser light overlappingly counter-propagate through the interior vapor space in multiple locations in the interior vapor space; and receives the radio frequency field from a radiofrequency source, such that the atomic vapor receives the radio frequency field and responds by changing energy of quantum levels in response to the radio frequency field; and at least one receiver member comprising: a photonic emitter disposed on the integrated photonic chip and in optical communication with the interior vapor space of the atomic vapor cell and that receives probe laser light and communicates the probe laser light to the interior vapor space; a pair of probe light reflectors disposed on the atomic vapor cell such that the pair of probe light reflectors is optically opposed across the interior vapor space and receives and reflects the probe laser light so that the probe laser light is reflected between the probe light reflectors multiple times in the interior vapor space; and a pair of coupling light reflectors disposed on the atomic vapor cell such that the pair of coupling light reflectors is optically opposed across the interior vapor space and receives and reflects the coupling laser light so that the coupling laser light is reflected between the coupling light reflectors multiple times in the interior vapor space.

Disclosed is a process for measuring a radio frequency electric field of a radio frequency field with a photonic Rydberg atom radio frequency receiver, the process comprising: performing the process with the photonic Rydberg atom radio frequency receiver that comprises: an integrated photonic chip; at least one atomic vapor cell hermetically disposed on the integrated photonic chip in which is disposed an atomic vapor and that comprises a cell wall that bounds an interior vapor space, such that the atomic vapor is disposed in the interior vapor space; and at least one receiver member comprising: a photonic emitter disposed on the integrated photonic chip and in optical communication with the interior vapor space of the atomic vapor cell; a pair of probe light reflectors disposed on the atomic vapor cell such that the pair of probe light reflectors is optically opposed across the interior vapor space; and a pair of coupling light reflectors disposed on the atomic vapor cell such that the pair of coupling light reflectors is optically opposed across the interior vapor space; receiving, by the photonic emitter, probe laser light and communicating the probe laser light from the photonic emitter to the interior vapor space; receiving and reflecting, by the pair of probe light reflectors, the probe laser light so that the probe laser light is reflected between the probe light reflectors multiple times in the interior vapor space; receiving and reflecting, by the by the pair of coupling light reflectors, the coupling laser light so that the coupling laser light is reflected between the coupling light reflectors multiple times in the interior vapor space; receiving, by the interior vapor space of the atomic vapor cell, the probe laser light from the photonic emitter and the coupling laser light; overlappingly counter-propagating the probe laser light and the coupling laser light through the interior vapor space in multiple locations in the interior vapor space due to being reflected respectively between the probe light reflectors and the coupling light reflectors multiple times in the interior vapor space; producing Rydberg atoms from the atomic vapor in the interior vapor space in a first quantum state in an absence of the radio frequency field; receiving, by the interior vapor space, the radio frequency field from a radiofrequency source, such that the atomic vapor receives the radio frequency field; changing the energy of the first quantum state of the Rydberg atoms in the atomic vapor in response to the atomic vapor receiving the radio frequency field; communicating the probe laser light from the interior vapor space, wherein the amount of the probe laser light that exits from the interior vapor space depends on the radio frequency electric field of the radio frequency field interacting with the Rydberg atoms in the interior vapor space.

BRIEF DESCRIPTION OF THE DRAWINGS

The following description cannot be considered limiting in any way. Various objectives, features, and advantages of the disclosed subject matter can be more fully appreciated with reference to the following detailed description of the disclosed subject matter when considered in connection with the following drawings, in which like reference numerals identify like elements.

DETAILED DESCRIPTION

Figure 1:
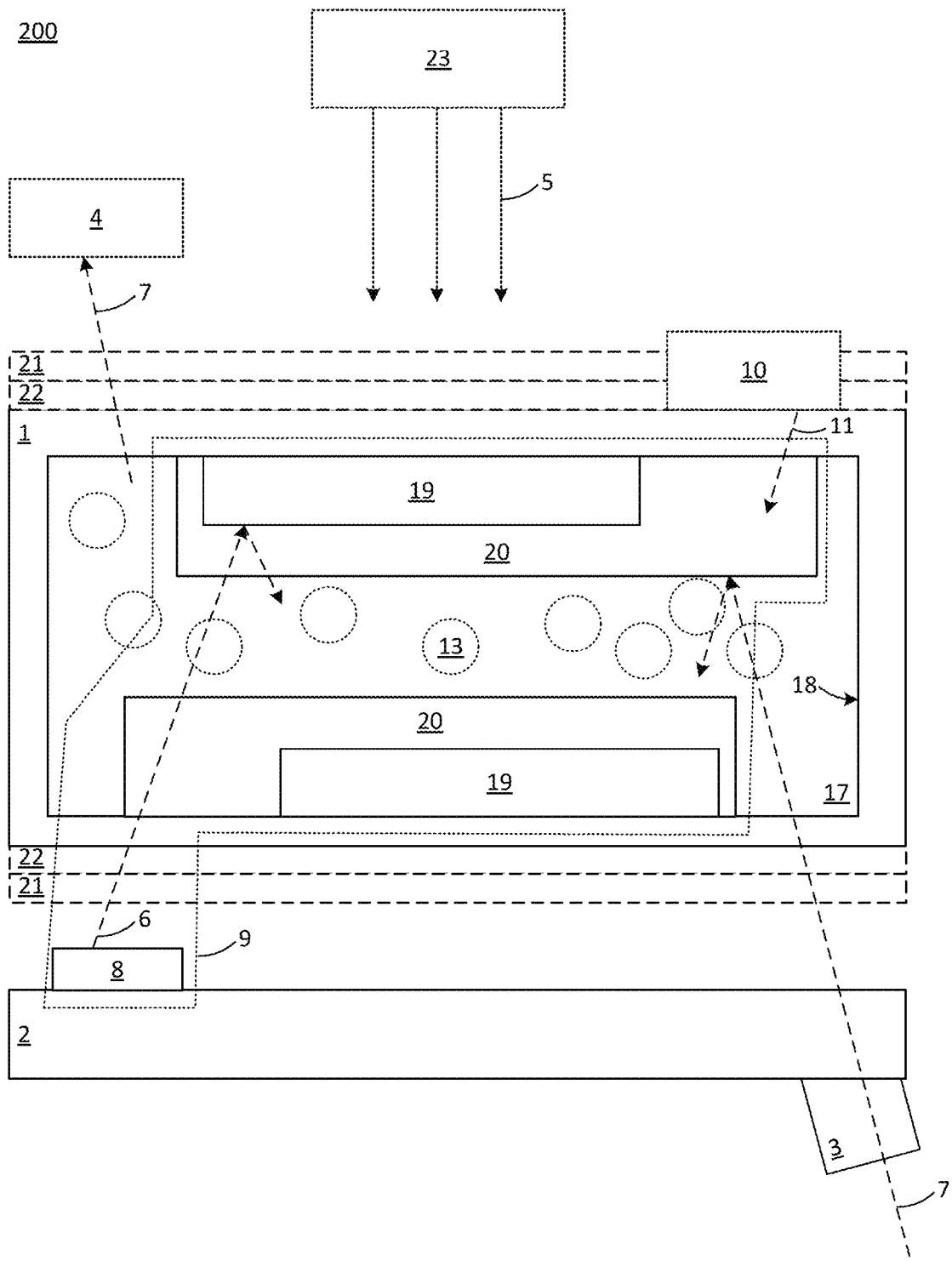
FIG. 1 shows a photonic Rydberg atom radio frequency receiver, according to some embodiments.
Figure 2:
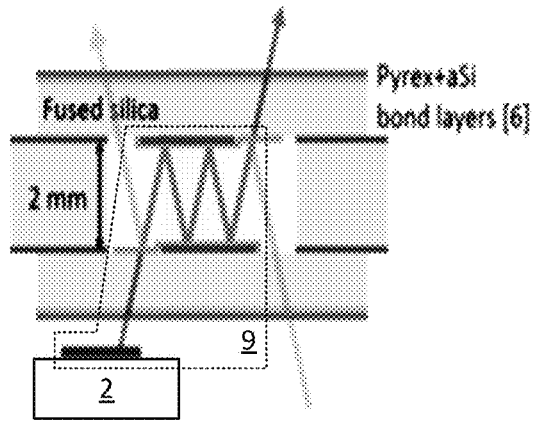
FIG. 2 shows a photonic Rydberg atom radio frequency receiver: (A) that includes a receiver member, (B) that includes a linear array of three receiver members, and (C) that includes a linear array of an arbitrary number of receiver members, according to some embodiments.
Figure 2:
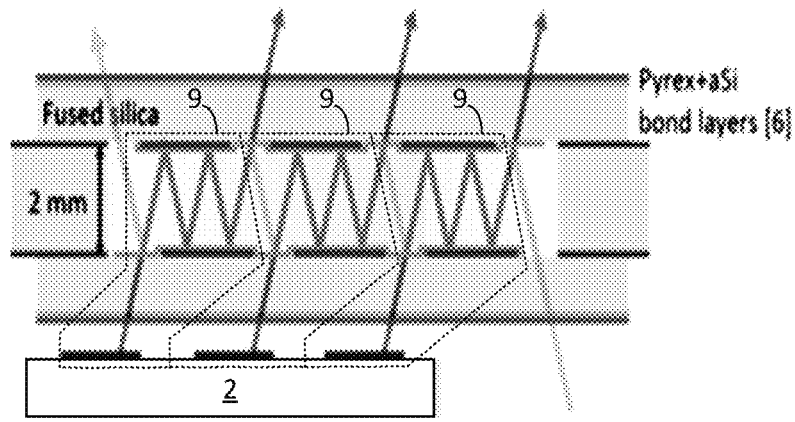
Figure 2:
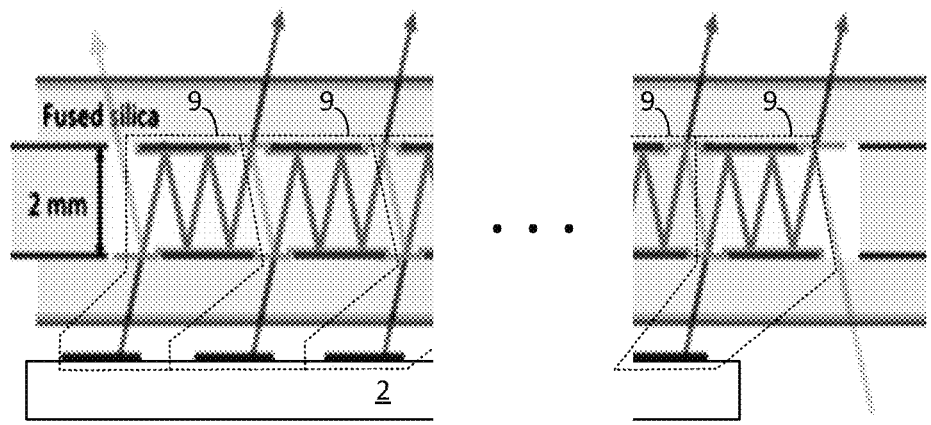
Figure 3:
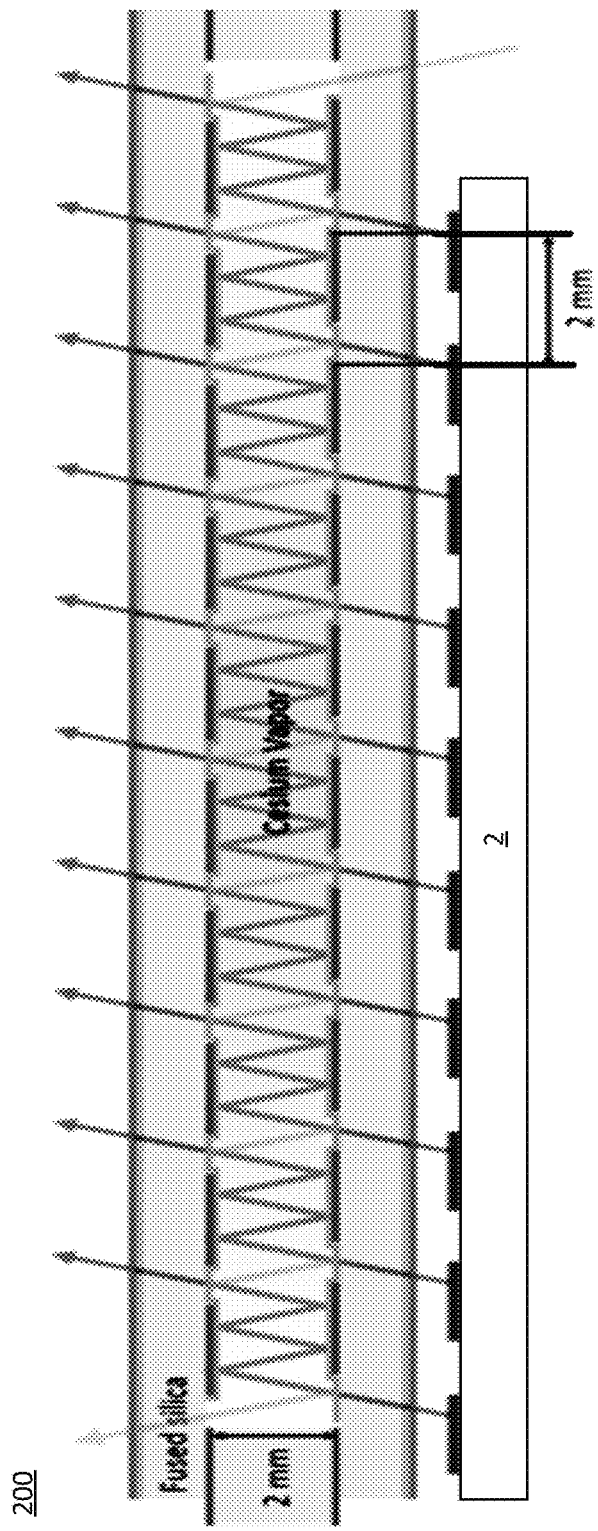
FIG. 3 shows a photonic Rydberg atom radio frequency receiver that includes a linear array of a plurality of receiver members, according to some embodiments.
Figure 4:
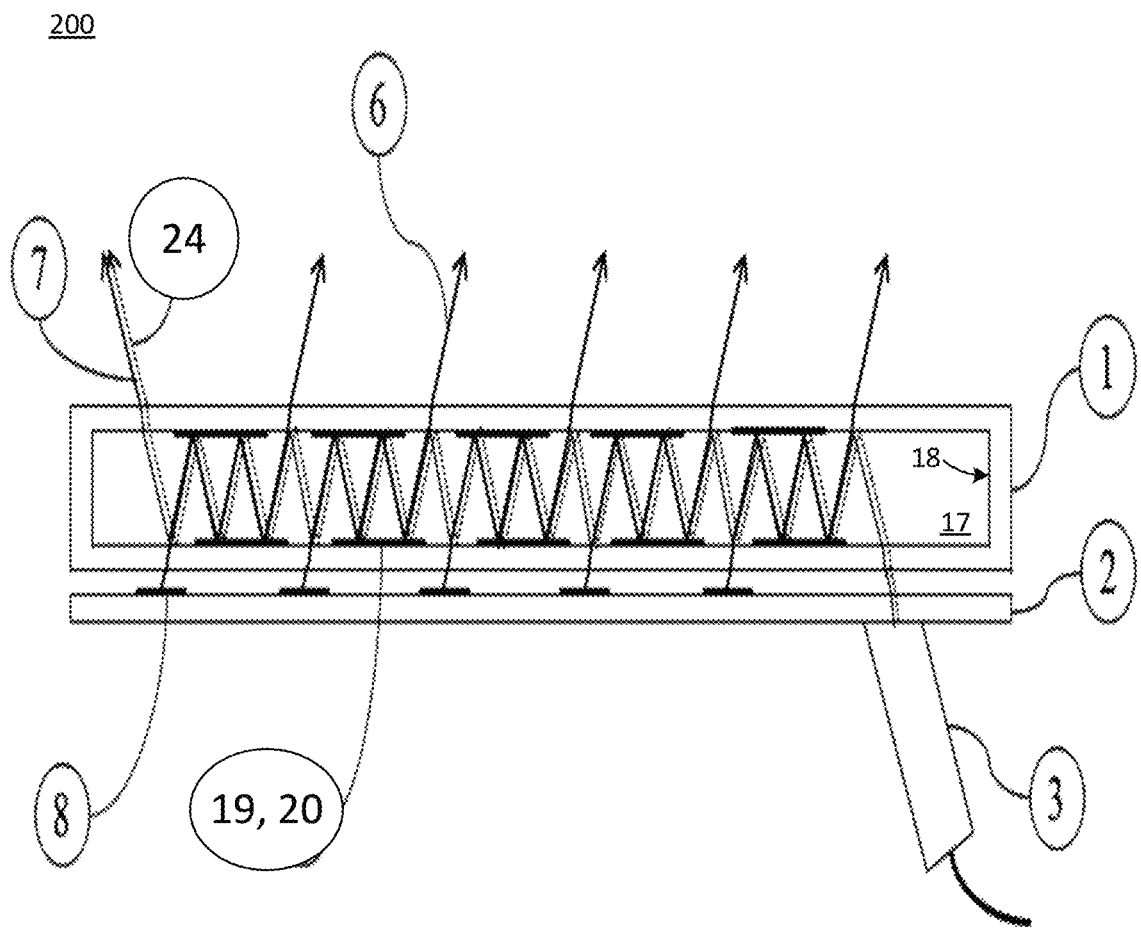
FIG. 4 shows a cross-section of a photonic Rydberg atom radio frequency receiver, according to some embodiments.
Figure 5:
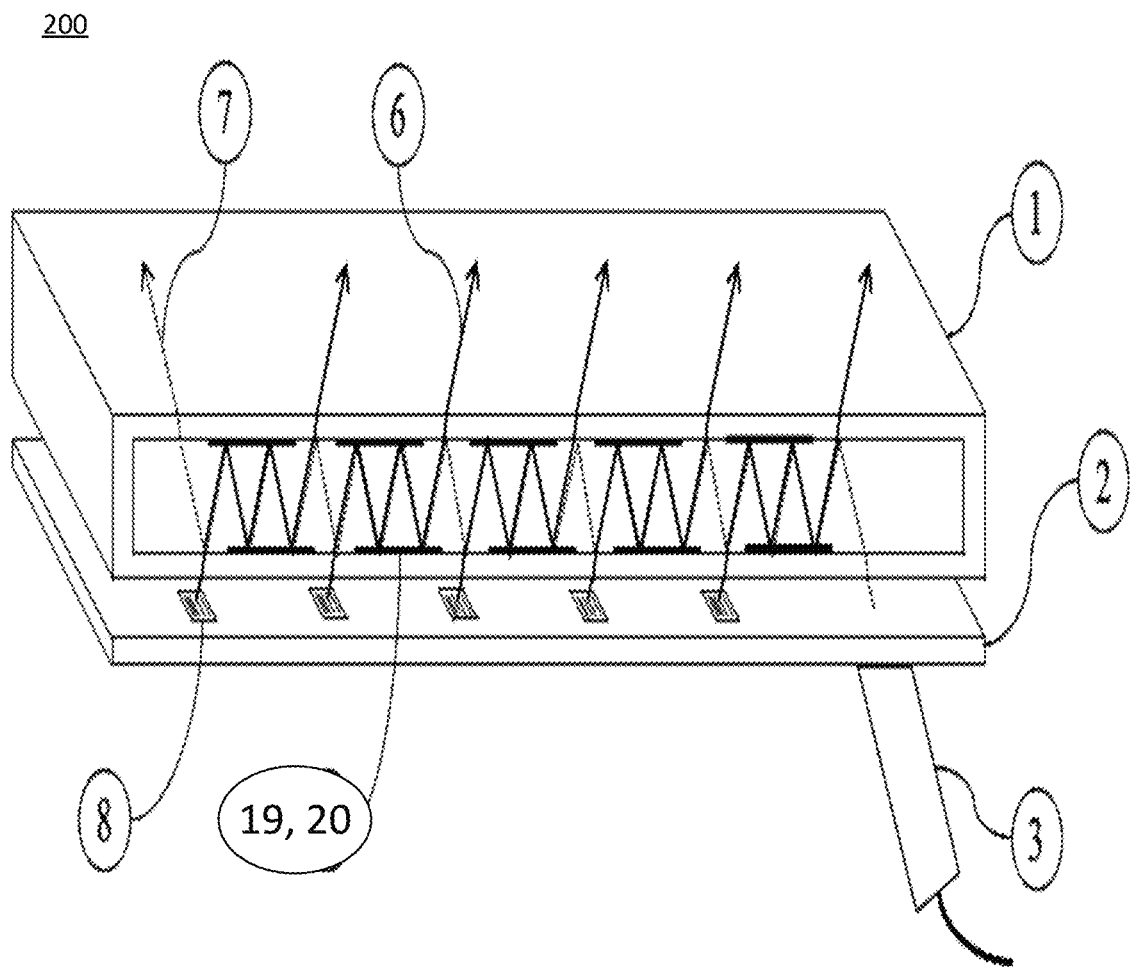
FIG. 5 shows a perspective view with a cross-section of the photonic Rydberg atom radio frequency receivers shown in FIG. 4, according to some embodiments.
Figure 6:
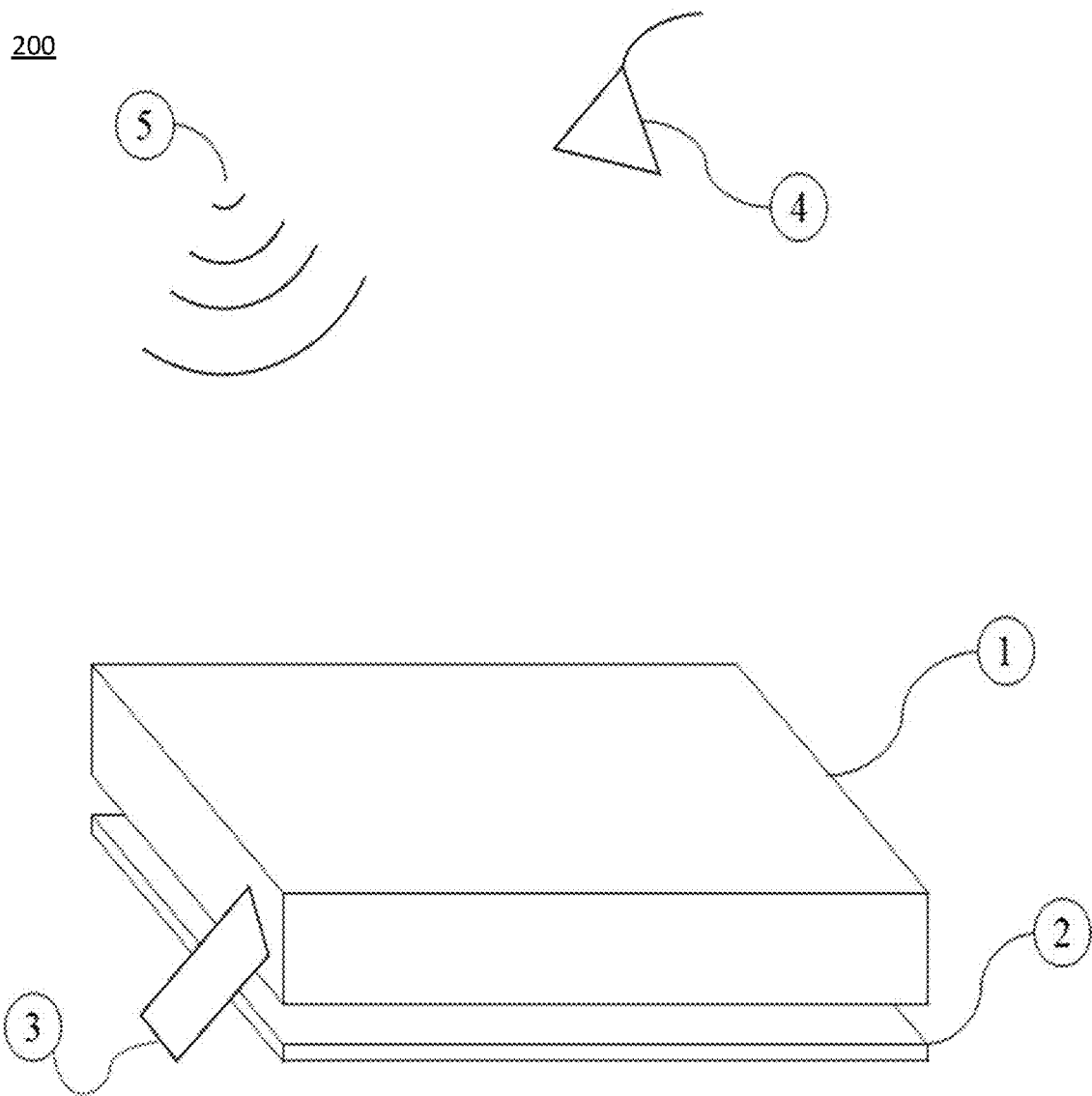
FIG. 6 shows a photonic Rydberg atom radio frequency receiver, according to some embodiments.
Figure 7:
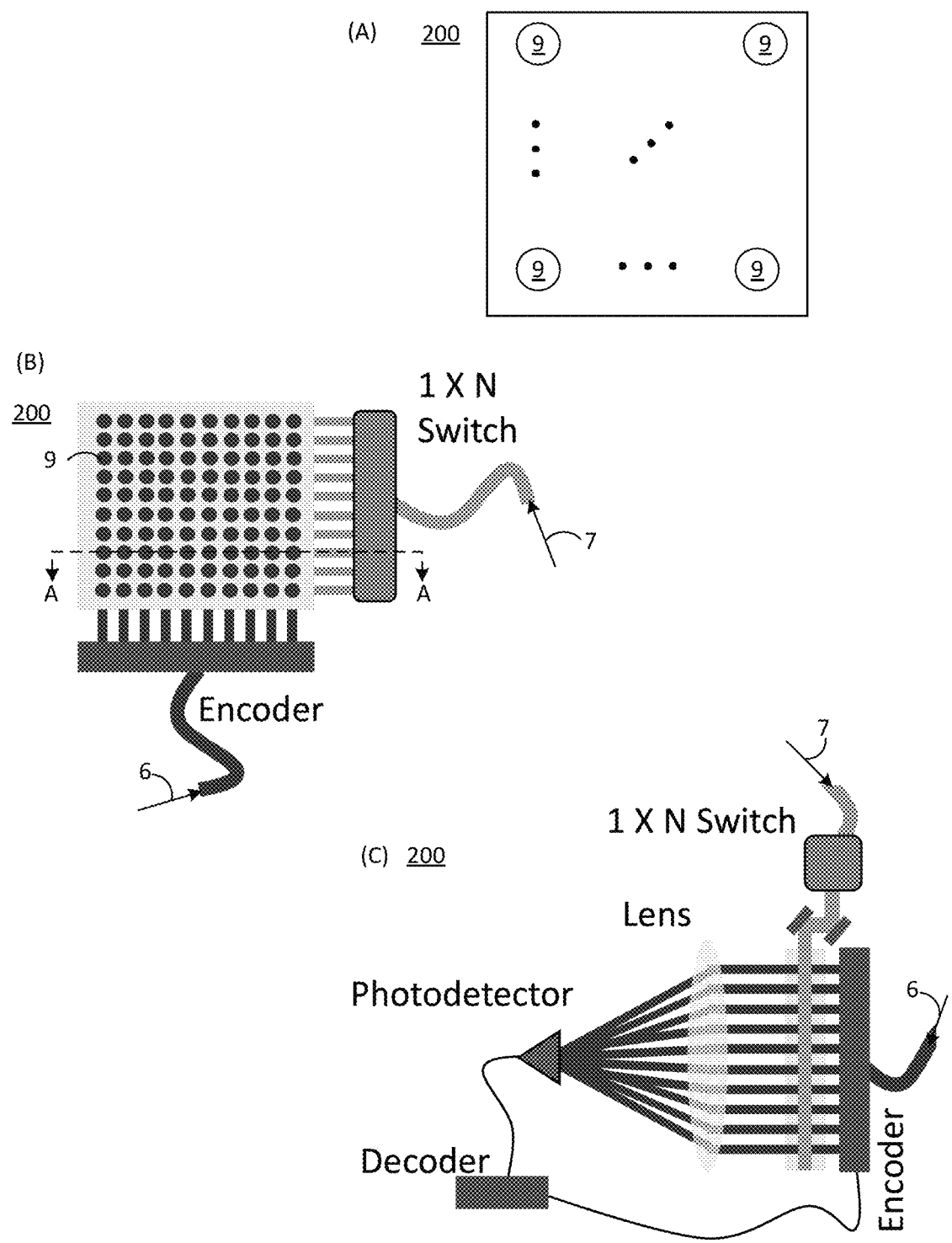
FIG. 7 shows a photonic Rydberg atom radio frequency receiver: (A) in plan view that includes a two-dimensional array of receiver members, (B) in plan view that includes a two-dimensional array of receiver members in communication with a switch and encoder for selectively providing coupling laser light and probe laser light to individual receiver members in the array, and (C) a cross-section along line A-A of the array shown in panel B with a lens, photodetector that receives probe laser light 6 from the array a,d a decoder that is used in determining spatial information about a radio frequency field that is received by the receiver members in the array, according to some embodiments.
Figure 8:
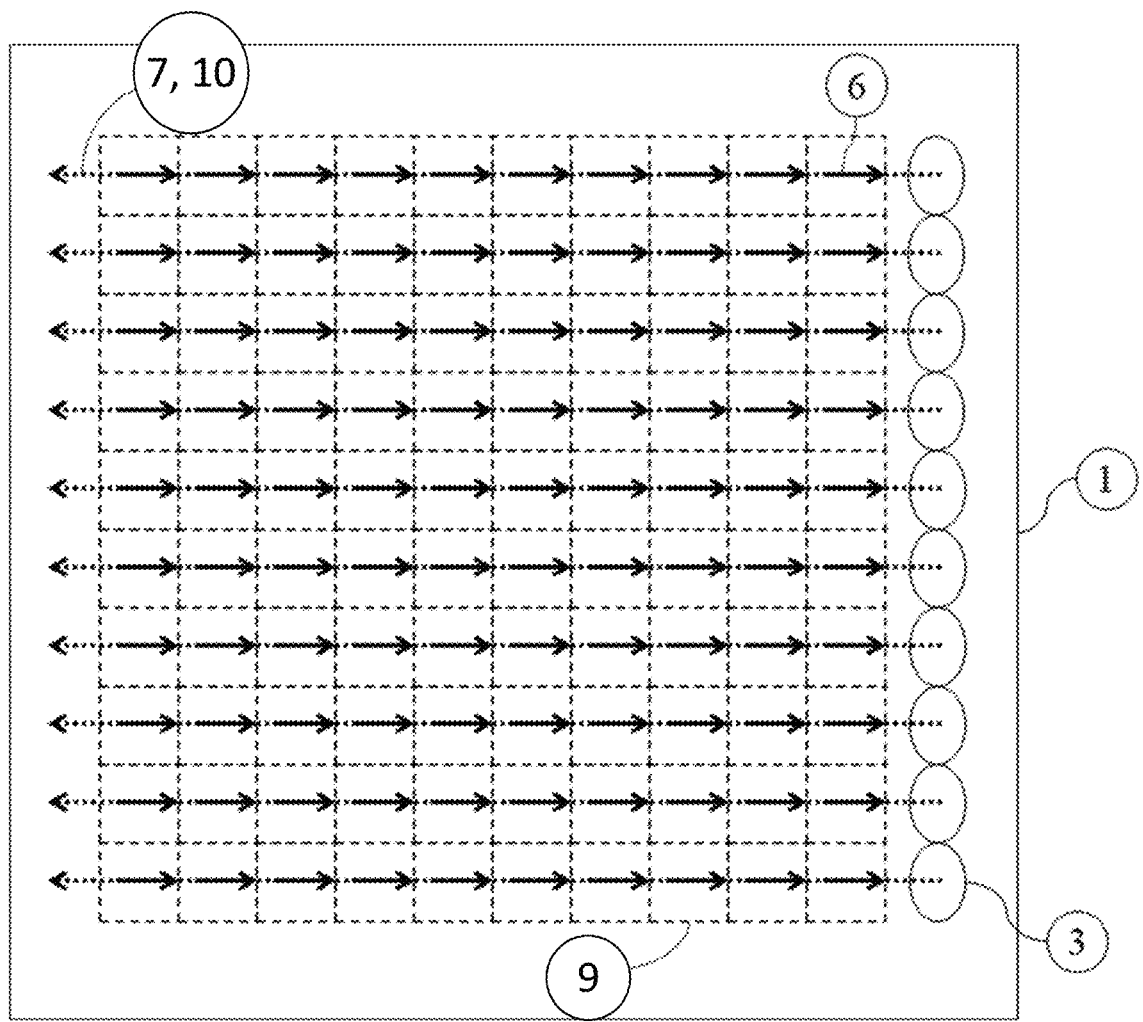
FIG. 8 shows a plan view photonic Rydberg atom radio frequency receiver that includes a two-dimensional array of receiver members, according to some embodiments.

A detailed description of one or more embodiments is presented herein by way of exemplification and not limitation.

Detection of the spatial dependence of radio frequency (RF) and sub-terahertz complex electric fields involves either phased antenna arrays or a single-point receiver that is translated over a synthetic aperture using mechanical positioners. A benefit of a Rydberg atom-based radio frequency receiver absence of metal components that scatter the radio frequency field. However, conventional Rydberg atom-based receivers for imaging, channel sounding, angle of arrival detection, and the like that involve measurement of the electric field at multiple spatial locations that is obtained by translating the atom-based receiver translated with a mechanical position and that is made from metal components that scatters the radio frequency field in complex, measurement-dependent ways. The photonic Rydberg atom radio frequency receiver 200 described herein solves this issue in an array of Rydberg atom-based receiver members 9.

RF electromagnetic waves are used in many applications from WiFi communication to radar, and accurately measuring them are still needed. Optically interrogated Rydberg atoms provide absolutely accurate, stable measurement of electric fields and specifically of RF electric fields from ~100 MHz to ~1 THz. However, conventional Rydberg sensors measure a single location at a time, typically averaging over a sensing volume that spans several millimeters along one of the spatial dimensions. For communications applications, there is an long-felt, unmet need to have a sensor technology that can distinguish and separately measure RF signals coming from multiple directions simultaneously, which requires simultaneous, tightly localized measurements at multiple spatially-separated locations. The photonic Rydberg atom radio frequency receiver 200 described fulfills this need.

The photonic Rydberg atom radio frequency receiver 200 can include an array of atomic vapor cells and photonic circuits that make RF measurements in a 1D or 2D array, e.g., of 10 to 100 or more spatial locations, wherein each measurement volume can be localized to a fraction of the RF wavelength in each of three spatial dimensions. The photonic Rydberg atom radio frequency receiver 200 can be cost effectively produced with batch microfabrication and has a novel combination of microfabricated photonic routing and beam emitters, a folded optical interaction path within a vapor cell, a common counter propagating coupling beam reused at multiple sensing locations, a multiplexed optical excitation and readout scheme allowing sharing of a single optical detector to measure multiple locations.

It has been discovered that a photonic Rydberg atom radio frequency receiver 200 described herein measures spatially-dependent radio frequency complex electric fields, e.g., the radio frequency electric field of radio frequency field 5. In an embodiment, with reference to FIG. 1, FIG. 2, FIG. 3, FIG. 4, FIG. 5, FIG. 6, FIG. 7, FIG. 8, FIG. 9, FIG. 10, FIG. 11, FIG. 12, FIG. 13, and FIG. 14 photonic Rydberg atom radio frequency receiver 200 includes: an integrated photonic chip 2; at least one atomic vapor cell 1 hermetically disposed on the integrated photonic chip 2 and that receives an atomic vapor 13 and that comprises a cell wall 18 that bounds an interior vapor space 17, such that the atomic vapor 13 is disposed in the interior vapor space 17 and that: receives the probe laser light 6 from the photonic emitter 8 and coupling laser light 7, such that probe laser light 6 and the coupling laser light 7 overlappingly counter-propagate through the interior vapor space 17 in multiple locations in the interior vapor space 17; and receives the radio frequency field 5 from a radiofrequency source 23, such that the atomic vapor 13 receives the radio frequency field 5 and responds by changing energy of quantum levels in response to the radio frequency field 5; and at least one receiver member 9 comprising: a photonic emitter 8 disposed on the integrated photonic chip 2 and in optical communication with the interior vapor space 17 of the atomic vapor cell 1 and that receives probe laser light 6 and communicates the probe laser light 6 to the interior vapor space 17; a pair of probe light reflectors 19 disposed on the atomic vapor cell 1 such that the pair of probe light reflectors 19 is optically opposed across the interior vapor space 17 and receives and reflects the probe laser light 6 so that the probe laser light 6 is reflected between the probe light reflectors 19 multiple times in the interior vapor space 17; and a pair of coupling light reflectors 20 disposed on the atomic vapor cell 1 such that the pair of coupling light reflectors 20 is optically opposed across the interior vapor space 17 and receives and reflects the coupling laser light 7 so that the coupling laser light 7 is reflected between the coupling light reflectors 20 multiple times in the interior vapor space 17.

In an embodiment, photonic Rydberg atom radio frequency receiver 200 includes coupling laser integrator 3 disposed on the integrated photonic chip 2 and that receives the coupling laser light 7 and communicates the coupling laser light 7 to the interior vapor space 17.

In an embodiment, photonic Rydberg atom radio frequency receiver 200 includes reference RF emitter 10 disposed on the atomic vapor cell 1 and that communicates a reference RF field 11 to the interior vapor space 17. In an embodiment, the photonic Rydberg atom radio frequency receiver 200 can be calibrated from the reference RF emitter 10.

In an embodiment, photonic Rydberg atom radio frequency receiver 200 includes detector 4 in optical communication with the interior vapor space 17 and that receives the coupling laser light 7 exiting from the interior vapor space 17.

In an embodiment, photonic Rydberg atom radio frequency receiver 200 includes radiofrequency source 23 in communication with the interior vapor space 17 and that communicates the radio frequency field 5 to the interior vapor space 17.

In an embodiment, photonic Rydberg atom radio frequency receiver 200 includes probe light antireflector 21 disposed on the atomic vapor cell 1 and that is an antireflective coating for the wavelength of the probe laser light 6.

In an embodiment, photonic Rydberg atom radio frequency receiver 200 includes coupling light antireflector 22 disposed on the atomic vapor cell 1 and that is an antireflective coating for the wavelength of the coupling laser light 7.

In an embodiment, probe laser light 6 and coupling laser light 7 interrogate the Rydberg state of the atomic vapor 13, such that the atomic vapor 13 is transparent to the probe laser light 6 in an absence of the radio frequency field 5 through the atomic vapor 13 in the interior vapor space 17.

In an embodiment, photonic Rydberg atom radio frequency receiver 200 comprises a plurality of the receiver members 9. In an embodiment, the receiver members 9 can be arranged in an array. In an embodiment, the array is a linear array disposed laterally along the atomic vapor cell 1. In an embodiment, the array is a two-dimensional array disposed laterally along the atomic vapor cell 1. In an embodiment, in the two-dimensional array, the receiver members 9 are arranged in rows and columns along the atomic vapor cell 1.

In an embodiment, photonic Rydberg atom radio frequency receiver 200 comprises a plurality of the atomic vapor cells 1 and a plurality of the receiver members 9, such that and each atomic vapor cell 1 is optically interrogated by at least one receiver member 9.

Figure 9:
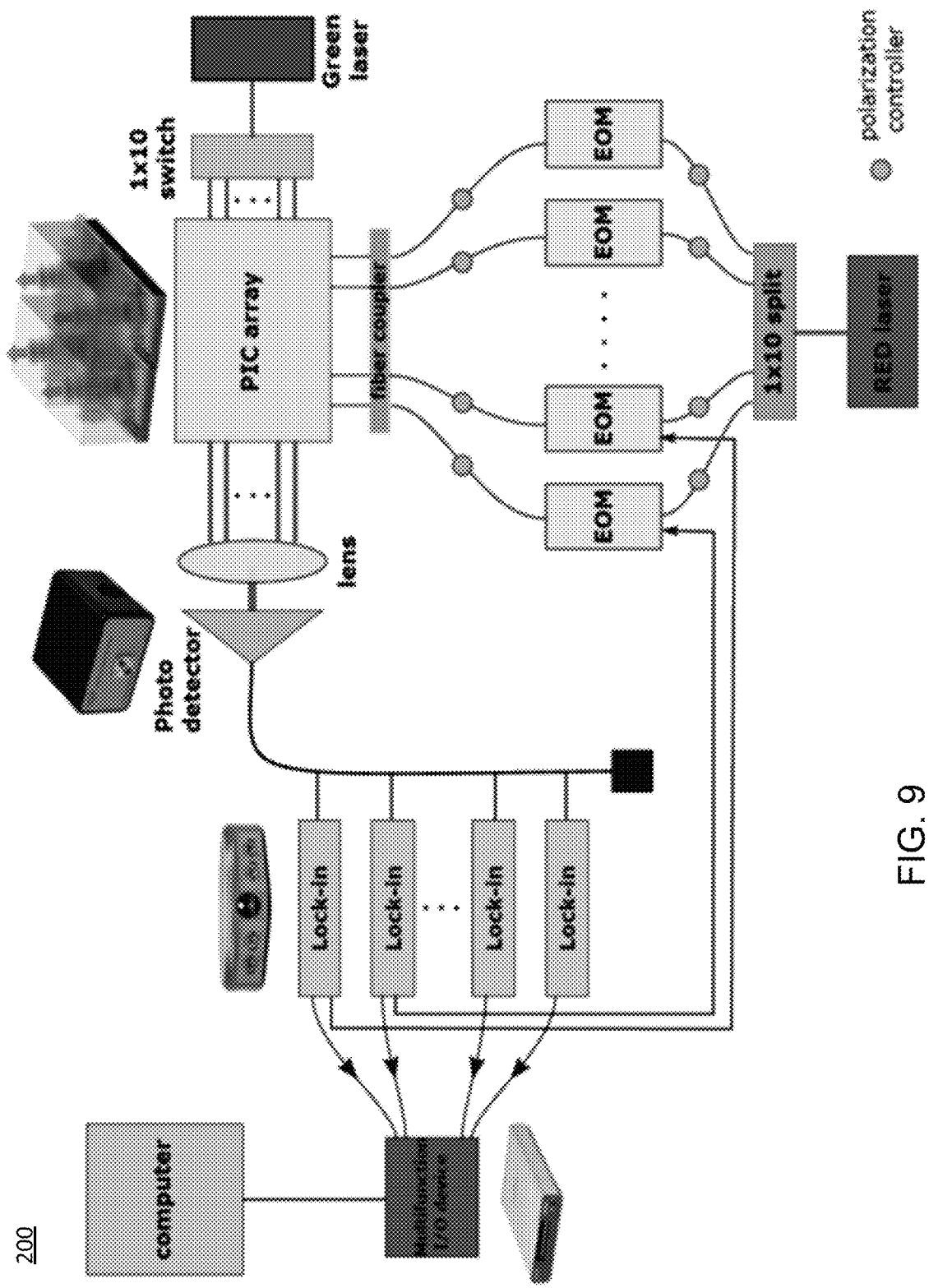
FIG. 9 shows a photonic Rydberg atom radio frequency receiver that includes a multiplex detection system for determining the radiofrequency electric field of a radio frequency field that is received by receiver members arranged in an array, according to some embodiments.
Figure 10:
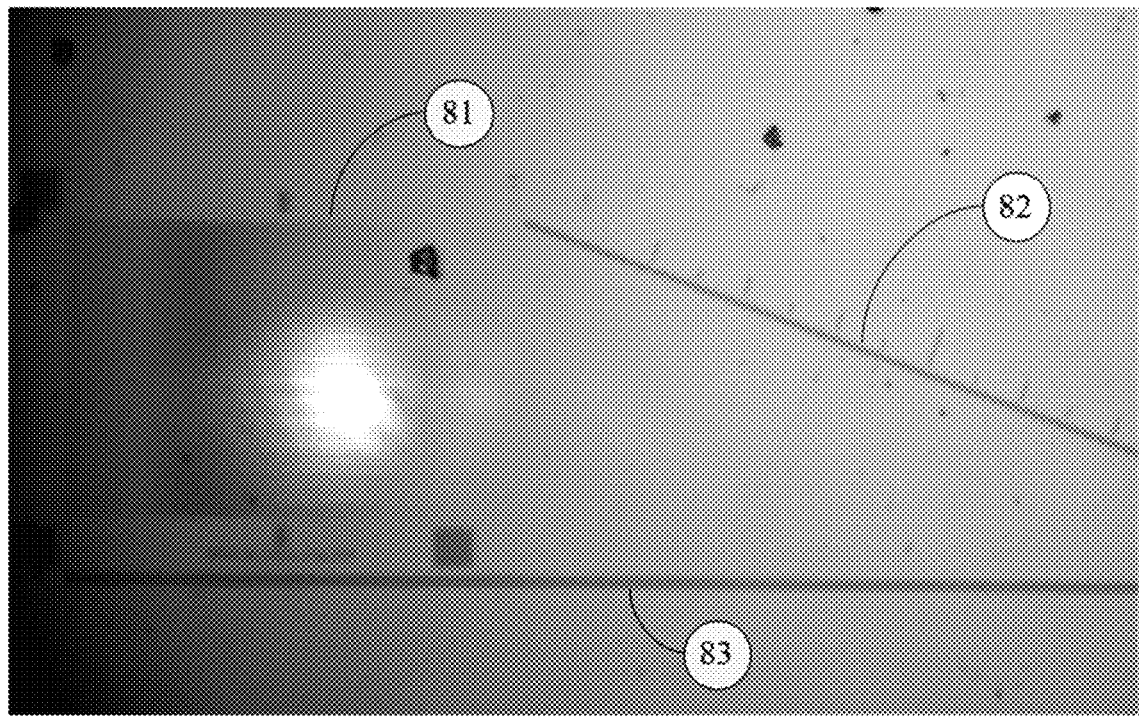
FIG. 10 shows a photonic emitter, according to some embodiments.
Figure 11:
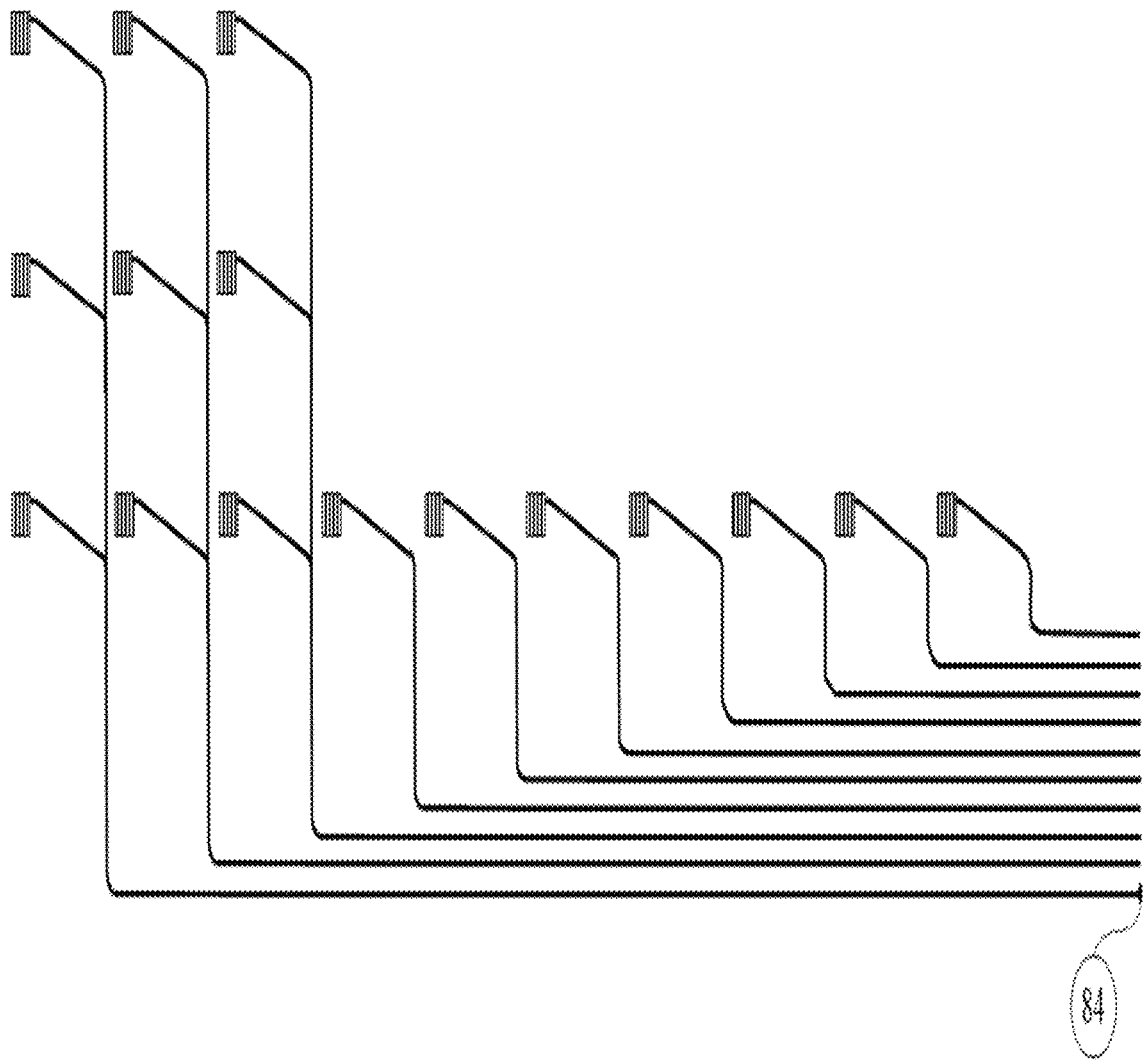
FIG. 11 shows an arrangement of photonic emitter, according to some embodiments.
Figure 12:
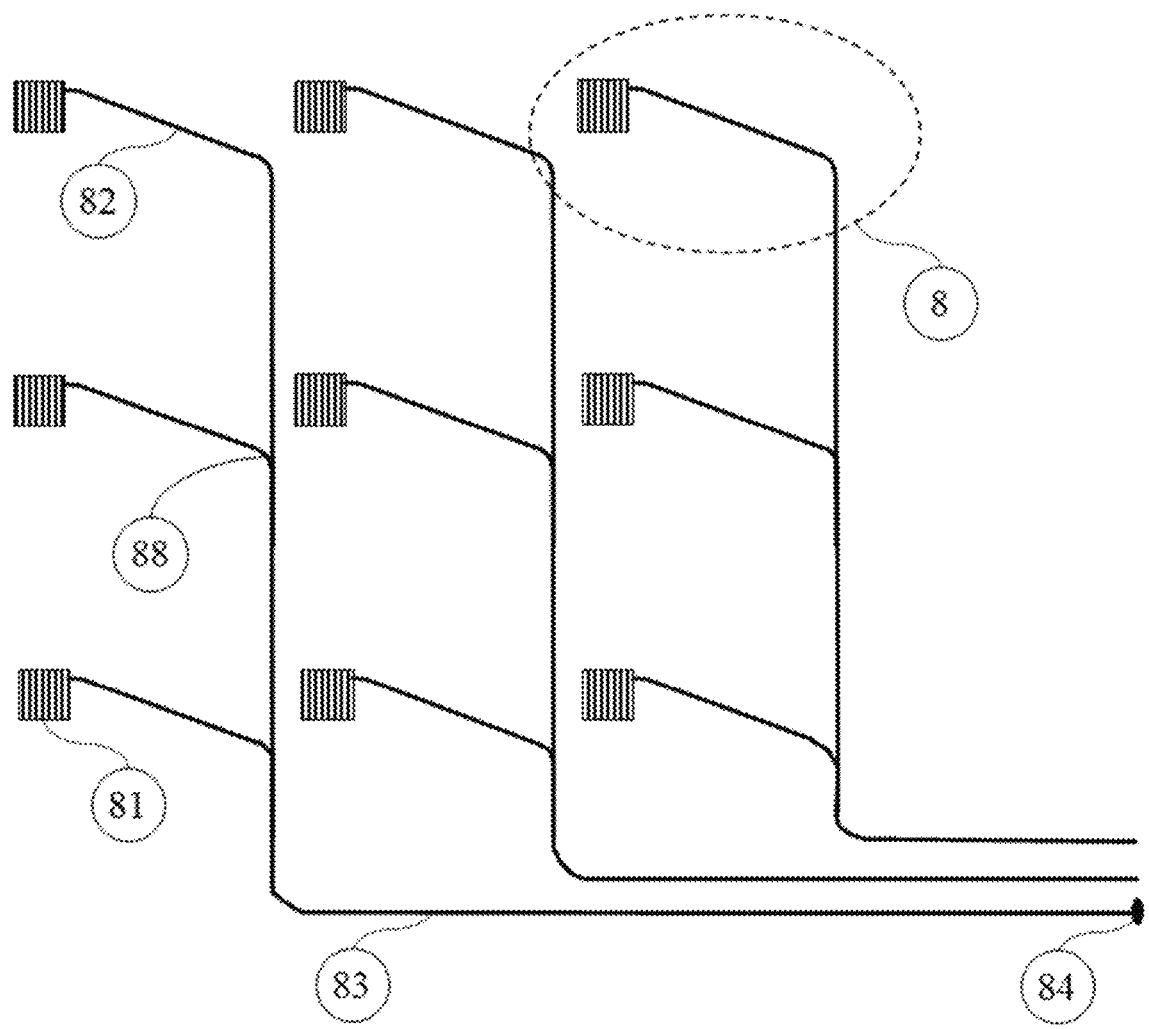
FIG. 12 shows an arrangement of photonic emitter, according to some embodiments.
Figure 13:
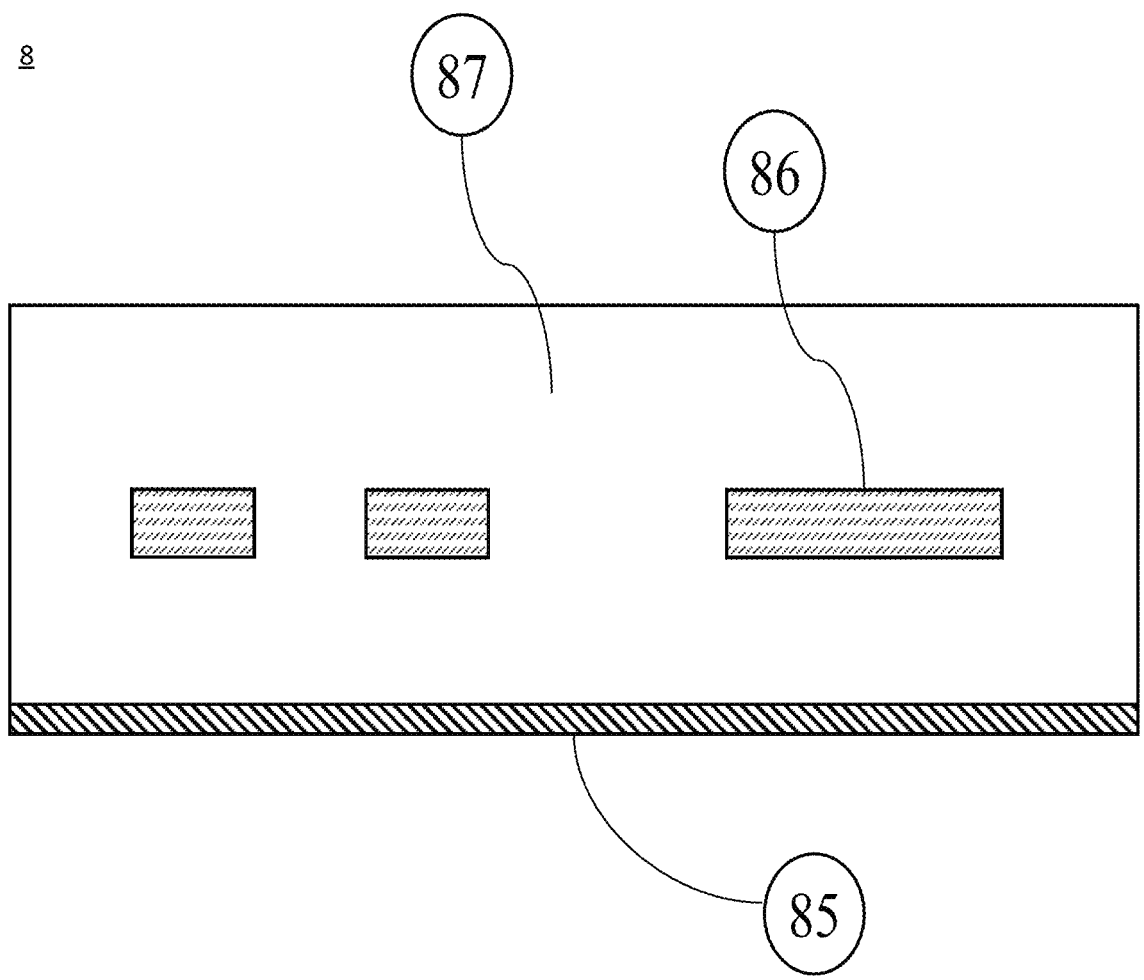
FIG. 13 shows a photonic emitter, according to some embodiments.

In an embodiment, with reference to FIG. 9, photonic Rydberg atom radio frequency receiver 200 includes a multiplexed detection system that receives the probe laser light 6 that exits from the interior vapor space 17, wherein the amount of the probe laser light 6 that exits from the interior vapor space 17 depends on the radio frequency electric field of the radio frequency field 5 interacting with the Rydberg atoms in the interior vapor space 17. The multiplexed detection system determines the radio frequency electric field of the radio frequency field 5 at multiple spatial locations of the photonic Rydberg atom radio frequency receiver 200 from the probe laser light 6 that exits from the interior vapor space 17.

Photonic Rydberg atom radio frequency receiver 200 can be made of various elements and components that are, e.g., microfabricated. Coatings and other optical materials used for photonic Rydberg atom radio frequency receiver 200 can be selected for transmission with laser wavelengths for that can include, without excluding other wavelengths applicable to interrogating Rydberg states, visible light from 400 nm to 700 nm, near infrared light from 700 nm to 1000 nm, or short-wave infrared from 1000 nm to 3000 nm. Operation with a laser wavelength near 1550 nm can provide integration with a large number of fiber optic components designed for telecommunications, making photonic Rydberg atom radio frequency receiver 200 scalable and compatible with off-the-shelf optical characterization tools.

Elements of photonic Rydberg atom radio frequency receiver 200 can be various sizes. It is contemplated that materials can be selected based on an application of, e.g., properties of radio frequency field 5. Lengths of various elements, e.g., cell wall 18 and the like, independently can be from 1 micrometer (μm) to 1 meter (m), specifically from 1 millimeter (mm) to 50 centimeters (cm), and more specifically from 1 mm to 10 cm.

Elements of photonic Rydberg atom radio frequency receiver 200 can be made of a material that is physically or chemically resilient in an environment in which photonic Rydberg atom radio frequency receiver 200 is disposed. Exemplary materials for optical coatings and cell walls include those which are transparent to probe laser light 6, coupling laser light 7, and radio frequency field 5. The elements of photonic Rydberg atom radio frequency receiver 200 can be made of the same or different material and can be monolithic in a single physical body or can be separate members that are physically joined. Transmission of a selected wavelength of light, e.g., transmission of visible light can be provided by fused silica.

Atomic vapor cell 1 holds alkali atoms in a vapor state of atomic vapor 13 when at room temperature in an absence or substantially no other gases and can include glass or another dielectric material. Optical coatings (19, 20, 21, 22) for antireflection (21, 22) or selective reflection (19, 20) of probe laser light 6, coupling laser light 7, or dressing laser light 24 can be disposed on atomic vapor cell 1.

Radio frequency field 5 measured by is communicated, e.g., over the air to. The frequency of can be from hundreds of megahertz to hundreds of gigahertz at a single tone or can be amplitude modulated, frequency modulated, or phase modulated.

Integrated photonic chip 2 has photonic emitter 8 disposed thereon that communicates probe laser light 6 to interior vapor space 17 and illuminates atomic vapor 13 in interior vapor space 17 at a multitude of localized locations (e.g., 10 locations in a one-dimensional array, 100 locations in a two-dimensional grid, and the like) at the selected angles for alignment with polarization provided by configuration and arrangement of photonic emitter 8. Photonic emitters 8 can include a grating that couples probe laser light 6 from waveguides on integrated photonic chip 2 out of plane to atomic vapor cell 1. Probe laser light 6 can be communicated to integrated photonic chip 2 by a fiber coupling to edge terminated waveguides.

Communicating coupling laser light 7 or dressing laser light 24 into atomic vapor cell 1 occurs such that coupling laser light 7 (dressing laser 24 when present) overlaps with probe lasers 6. Such can occur by integrated photonics or fiber coupling.

A detector 4 can be any number of detectors, e.g., 1, 2, or an array of detectors 4. Detector 4 detects transmitted power of the set of probe lasers 6 following interaction with atomic vapor 13 in atomic vapor cell 1. Detector 4 can be located behind integrated photonic chip 2 or in front of atomic vapor cell 1, as shown in the figures.

A plurality of photonic emitters 8 can be fabricated on the surface of the integrated photonic chip 2. With reference to FIG. 9, FIG. 10, FIG. 11, FIG. 12, and FIG. 13, photonic emitter 8 can be individually connected via waveguide 83 to fiber coupler 84. The waveguides 83 and fiber couplers 84 are disposed on the integrated photonic chip 2. Fiber coupler 84 can be an inverse taper coupler disposed at one edge of the integrated photonic chip 2. Photonic emitter 8 can include a large grating coupler 81 and an evanescent expander 82. Evanescent expander 82 expands the input light (e.g., probe laser light 6) from waveguide 83 onto grating 81. The grating 81 communicates probe laser light 6 into free space proximate to integrated photonic chip 2.

The integrated photonic chip 2 with photonic emitters 8, waveguides 83, and fiber couplers 84 are arranged in a microstructured waveguiding layer 86 surrounded by cladding layer 87 disposed on the surface of a dielectric substrate 85. The material for substrate 85 can be glass, fused silica, or similar dielectric material. Waveguiding layer 86 can include silicon nitride, tantalla, titania, alumina, or similar dielectric with high refractive index substantially greater than about 1.5. The cladding layer 87 can include a low index dielectric cladding material such as silicon dioxide with the refractive index of about 1.45.

Each column of multiple photonic emitters 8 can be connected to a single waveguide 83 through one or more beamsplitters 88.

The receiver member 9 can include a discrete, localized combination of probe laser 6, coupling laser 7, optional dressing laser 24, and photonic emitter 8 and various optical reflectors (e.g., 19, 20) to provide a single spatially localized measure of the radio frequency electric field 5. Coupling laser 7 and optional dressing laser 24 can be shared between multiple receiver elements 9 for optimal power use.

Figure 14:
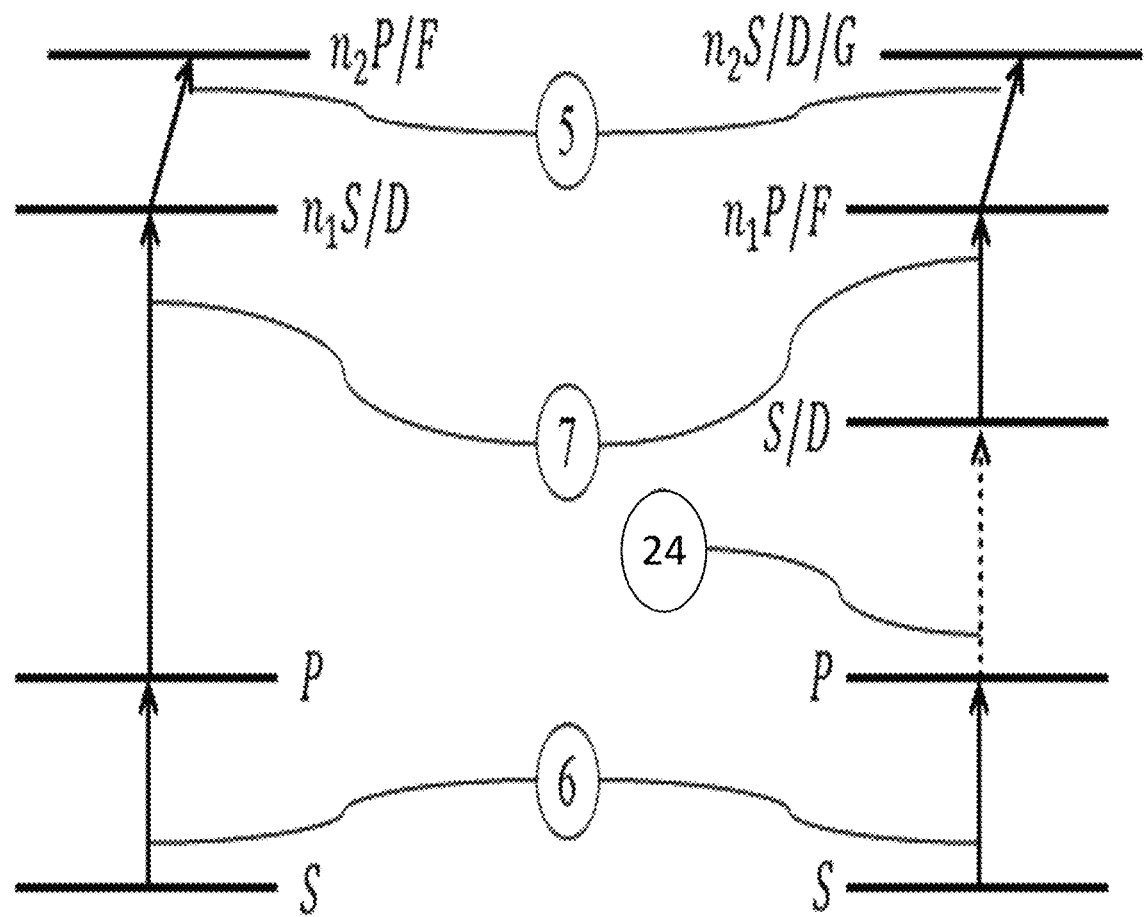
FIG. 14 shows an energy level diagram for quantum states for atoms in atomic vapor disposed in an interior vapor space of an atomic vapor cell of a photonic Rydberg atom radio frequency receiver and that are subjected to radio frequency field, probe laser light, coupling laser light, or reference RF field, according to some embodiments.

With reference to FIG. 14, excitation of alkali atoms in atomic vapor 13 can occur via a number of quantum states with probe laser light 6 resonant with a ground transition between an S state (orbital angular momentum of 1) and a P state (orbital angular momentum of 2) and coupling laser light 7 resonant with the P state and a Rydberg state that has a high principle quantum number, n, that is nearby another Rydberg state that is one radio frequency (5) energy level away. Some additional lasers that provide dressing laser light 24 can be with the probe laser light 6 and coupling laser light 7 to produce the first Rydberg state with potential benefits to the sensitivity of photonic Rydberg atom radio frequency receiver 200.

An optional radiated radio frequency local oscillator, radio frequency tuning field, or static electric field for frequency tuning can be included in photonic Rydberg atom radio frequency receiver 200.

Amplitude modulation of probe laser light 6, coupling laser light 7, or dressing laser light 24 can occur, e.g., by a lock-in amplifier at the point of the detector 4 for demodulation, rapid multiplexing the response of many localized probe lasers, or improved sensitivity.

The atomic vapor cell 201 can be a hermetically sealed vessel that maintains a pressure that can be high vacuum (e.g., less than 1e-7 Torr). The atomic vapor cell 1 can be filled with atomic vapor 13 at room temperature and in an absence of a buffer gas. The vapor cell 201 cab be made of glass, like borosilicate or fused silica, or other dielectric material with minimal absorption of radio frequency fields. The faces of the vapor cell 201 can include an optical coating for antireflection of probe laser light 6, coupling laser light 7, or dressing laser light 24 upon entering and exiting the vapor cell 201 and can include reflective coatings (e.g., 19. 20) for selective reflection of probe laser light 6, coupling laser light 7, or dressing laser light 24.

The probe laser light 6 communicates through atomic vapor cell 1 once or is reflected several times (such as by the outer wall of atomic vapor cell 1 or cell wall 18 of interior vapor space 17) to create a longer interaction path between laser light (6, 7, 24) and atomic vapor 13 to increase the signal strength. The interaction of each single beam of probe laser light 6 with the atoms in atomic vapor 13 can be spatially localized to a region not exceeding a small fraction of the radio frequency wavelength, such as 0.5 of a wave to 1/50 of a wave, e.g., in all three spatial dimensions. This enables efficient and high spatial resolution sampling of the radio frequency field 5 for high directionality sensing by photonic Rydberg atom radio frequency receiver 200.

The coupling laser light 7 or dressing laser light 24 can be introduced separately to each spatial location of probe laser light 6 in atomic vapor cell 1, e.g., such as a row of probe laser lights 6, by simultaneously illuminating them with a single coupling laser light 7 or dressing laser light 24, reducing the total required coupling or dressing laser power. Recycling of the power of coupling laser light 7 or dressing laser light 24 can occur in this manner due to minimal absorption by the atoms in atomic vapor 13. The coupling laser light 7 or dressing laser light 24 can counter-propagate with respect to probe laser lights 6 or oriented in a star pattern to minimize Doppler broadening effects of the electromagnetically induced transparency spectral line feature, which affects sensitivity.

A plurality of optical detectors 4 can detect probe laser lights 6 that are separately communicated from various atomic vapor cells 1. Alternatively, fewer detectors 4 or a single detector 4 can detect several probe laser light beams simultaneously. Using a single detector 4 can occur because light from many probe laser light beams can be transmitted to a single remote detector via free space or via coupling to a single multimode fiber. This avoids complicated alignment of multiple detectors to individual probe lasers and allows remote placement of the detector and associated electronics, decreasing their influence on and reflection of the external radio frequency field being measured.

Probe laser light 6, coupling laser light 7, or dressing laser light 24 can be communicated into by optical fiber attached to integrated photonic chip 2. The coupling laser light 7, or dressing laser light 24 can be introduced from fibers by collimators such as a GRIN lens array.

Photonic Rydberg atom radio frequency receiver 200 can be made in various ways. It should be appreciated that photonic Rydberg atom radio frequency receiver 200 includes a number of optical, electrical, or mechanical components, wherein such components can be interconnected and placed in communication (e.g., optical communication, electrical communication, mechanical communication, and the like) by physical, chemical, optical, or free-space interconnects. The components can be disposed on mounts that can be disposed on a bulkhead for alignment or physical compartmentalization. As a result, photonic Rydberg atom radio frequency receiver 200 can be disposed in a terrestrial environment or space environment. Elements of photonic Rydberg atom radio frequency receiver 200 can be formed suitable materials, such as glass, fused silica, and the like. According to an embodiment, the elements of photonic Rydberg atom radio frequency receiver 200 are formed using microfabrication or other suitable method. Accordingly, photonic Rydberg atom radio frequency receiver 200 can be made by additive or subtractive manufacturing. In an embodiment, elements of photonic Rydberg atom radio frequency receiver 200 can be subject to selective removal of various different materials using, e.g., etchants and photolithographic masks and procedures. The various layers thus formed can be subjected to joining by bonding to form photonic Rydberg atom radio frequency receiver 200.

It is contemplated that components of photonic Rydberg atom radio frequency receiver 200, e.g., atomic vapor cell 1, can be made according to processes described in U.S. patent application Ser. No. 17/374,537, the disclosure of which is incorporated by reference herein in its entirety.

The integrated photonic chip 2 and photonic emitter 8 can be made according to the process described in Kim et al., "Photonic waveguide to free-space Gaussian beam extreme mode converter," Light Sci. Appl. 7, 72 (2018) (available at https://doi.org/10.1038/s41377-018-0073-2), the disclosure of which is incorporated by reference herein in its entirety.

Communication of coupling laser light 7 and dressing laser light 24 can be achieved by adhesive bonding of an optical fiber with a collimating terminator to atomic vapor cell 1. It is contemplated that these lasers can included on the same integrated photonic chip 2 as the probe laser light optics with a set of waveguides and photonic emitters 8 including fiber couplers that communicate the laser light to integrated photonic chip 2.

Integration of atomic vapor cell 1 and integrated photonic chip 2 can be achieved by adhesive bonding (e.g., SU8 or some similar precision spacer) with, e.g., a 100 um alignment accuracy in any of three cartesian spatial directions and angular alignment that may not exceed the spatial alignment at the edges or far extent of photonic Rydberg atom radio frequency receiver 200.

Photonic Rydberg atom radio frequency receiver 200 has numerous advantageous and unexpected benefits and uses. In an embodiment, a process for measuring a radio frequency electric field includes: performing the process with the photonic Rydberg atom radio frequency receiver 200 that comprises: an integrated photonic chip 2; at least one atomic vapor cell 1 hermetically disposed on the integrated photonic chip 2 in which is disposed an atomic vapor 13 and that comprises a cell wall 18 that bounds an interior vapor space 17, such that the atomic vapor 13 is disposed in the interior vapor space 17; and at least one receiver member 9 comprising: a photonic emitter 8 disposed on the integrated photonic chip 2 and in optical communication with the interior vapor space 17 of the atomic vapor cell 1; a pair of probe light reflectors 19 disposed on the atomic vapor cell 1 such that the pair of probe light reflectors 19 is optically opposed across the interior vapor space 17; and a pair of coupling light reflectors 20 disposed on the atomic vapor cell 1 such that the pair of coupling light reflectors 20 is optically opposed across the interior vapor space 17; receiving, by the photonic emitter 8, probe laser light 6 and communicating the probe laser light 6 from the photonic emitter 8 to the interior vapor space 17; receiving and reflecting, by the pair of probe light reflectors 19, the probe laser light 6 so that the probe laser light 6 is reflected between the probe light reflectors 19 multiple times in the interior vapor space 17; receiving and reflecting, by the by the pair of coupling light reflectors 20, the coupling laser light 7 so that the coupling laser light 7 is reflected between the coupling light reflectors 20 multiple times in the interior vapor space 17; receiving, by the interior vapor space 17 of the atomic vapor cell 1, the probe laser light 6 from the photonic emitter 8 and the coupling laser light 7; overlappingly counter-propagating the probe laser light 6 and the coupling laser light 7 through the interior vapor space 17 in multiple locations in the interior vapor space 17 due to being reflected respectively between the probe light reflectors 19 and the coupling light reflectors 20 multiple times in the interior vapor space 17; producing Rydberg atoms from the atomic vapor 13 in the interior vapor space 17 in a first quantum state in an absence of the radio frequency field 5; receiving, by the interior vapor space 17, the radio frequency field 5 from a radiofrequency source 23, such that the atomic vapor 13 receives the radio frequency field 5; changing the energy of the first quantum state of the Rydberg atoms in the atomic vapor 13 in response to the atomic vapor 13 receiving the radio frequency field 5; and communicating the probe laser light 6 from the interior vapor space 17, wherein the amount of the probe laser light 6 that exits from the interior vapor space 17 depends on the radio frequency electric field of the radio frequency field 5 interacting with the Rydberg atoms in the interior vapor space 17.

In an embodiment, the process for measuring a radio frequency electric field includes determining the radio frequency electric field of the radio frequency field 5 at multiple spatial locations of the photonic Rydberg atom radio frequency receiver 200 from the probe laser light 6 that exits from the interior vapor space 17.

It is contemplated that photonic Rydberg atom radio frequency receiver 200 can measure the magnitude or phase of an electromagnetic (EM) field in a two-dimension grid in space. It is contemplated that measuring the magnitude and phase of radio frequency field 5 can be accomplished at a single point in space according to processes described in U.S. Pat. Nos. 10,979,147 and 11,165,505 and U.S. patent application Ser. No. 16/818,330, the disclosure of each of which is incorporated by reference herein in its entirety.

The photonic Rydberg atom radio frequency receiver measures over-the-air radio frequency electric field 5 across a range of spatial locations without mechanical positioners. The photonic Rydberg atom radio frequency receiver 200 is minimally perturbative to radio frequency electric field 5 with minimal or no use of metallic or conductive components. Measurement of the radio frequency electric field 5 is achieved by absorption spectroscopy detection of a localized set of probe laser lights 6 following interaction with room-temperature alkali atoms in atomic vapor 13 excited to a Rydberg state by coupling laser light 7 or dressing laser light 24 or other radio frequency or direct current electric fields. The combination of laser frequencies is selected to electromagnetically induce transparency of the atoms to the probe laser over a narrow window of frequencies. This narrow line feature is highly sensitive to radio frequency electric fields and will change shape and frequency upon exposure to a radio frequency field as described by quantum mechanics. When all lasers are frequency locked, the transmitted power of each probe laser through the atomic vapor cell depends on the local radio frequency field and is measured by the optical detector. Reference radio frequency fields 11 can be provided from an external source or a near- or far-field emitter 10. The atoms in atomic vapor 13 responds as a mixer to the reference field and radio frequency field 5 due to interference such that both the local phase and vector amplitude of the external incident field is determined by photonic Rydberg atom radio frequency receiver 200 that provide the distribution of incident angles and directions of the radio frequency field 5.

Measuring the spatially dependent radio frequency complex electric field is achieved first by applying multiplexing scheme to collect information from several probe lasers (for example, 100 lasers in a 10×10 array) via a single detector. First, all probe laser photonic emitters are divided into m groups (e.g. m=10 columns of n=10 emitters each), and laser light for each group is encoded by a unique code in the time domain, such as by being intensity-modulated at a distinct frequency. This can be accomplished by an external or an on-chip electro-optic modulator. Each encoded input probe light is then photonically routed to and split between the multiple photonic emitters in the same group and emitted toward the atoms. The coupling light is arranged into n (e.g., n=10 rows of emitters) separate beams, each illuminating m probe locations, one each from m groups (e.g., one from each of m=10 columns). The coupling light is also encoded in time, for example, illuminating the n rows sequentially by connecting the n rows to a single coupling light source via a 1×n optical switch. The single detector output can then be used for unambiguous determination of the transmitted probe powers coming from 100 locations by lock-in demodulation at m=10 distinct column frequencies for n=10 distinct time intervals selecting the rows. Other encoding schemes can be used such as Hadamard codes or double lock-in detection with modulating both probe and coupling lasers, as well as other encoding and decoding schemes.

Applying a phase stable local oscillator reference to all the receiver elements provides measurement of an incident radio frequency electric field phase as a function of spatial location across the receiver array. This local oscillator can be a radiated radio frequency source at a small difference in frequency (typically 10 s of kilohertz) from the signal radio frequency field to be measured and may involve a transmitting antenna external to the photonic Rydberg atom receiver array or may involve an integrated antenna with the receiver array. The recorded transmitted probe laser power of each receiver element in the receiver array is then a time varying sinusoidal signal at the intermediate frequency between the local oscillator and signal radio frequency fields. Referencing the time dependent transmitted probe laser power of all receiver elements in the array to a single receiver element provides a spatially dependent measure of the signal radio frequency electric field phase across the array relative to one element in the array. Such information can be used to measure the angle of arrival of the signal radio frequency field, measure the beam formed output of a transmitting antenna, locate scatterers in a microwave channel, and other related applications.

The coupling laser light can be introduced separately to each probe spatial location or preferably to multiple probe locations (such as one row in a 2D probe array) by simultaneously illuminating them with a single coupling laser beam, reducing the total required coupling beam power, as well as enabling multiplexed readout. A straight coupling beam can directly traverse multiple probe spatial locations or be reflected, for example, by cell walls, to traverse multiple probe locations. When the coupling beam traverses a probe location, it is directed to propagate in the direction exactly opposite to the direction of the probe beam by being appropriately reflected. This minimizes the measurement's systematic and statistical uncertainties.

With reference to FIG. 7, FIG. 8, FIG. 9, FIG. 10, FIG. 11, FIG. 12, and FIG. 13, a multiplexing detection system collects information from several probe beams (e.g. m×n=100 beams in 10×10 array) via a single detector. First, all probe beam photonic emitters are divided into m groups (e.g. m=10 columns of n=10 emitters each) and laser light for each group is encoded by a unique code in the time domain, such as by being intensity-modulated at a distinct frequency. This may be accomplished by an external(s10,11) or an on-chip electro-optic modulator. Each encoded input probe light is then photonically routed to and split between the multiple probe emitters in the same group and emitted toward the atoms. The coupling light is arranged into n (e.g. n=10 rows of emitters) separate beams, each beam illuminating m probe locations, one each from m groups (e.g. one from each of m=10 columns). The coupling light is also encoded in time such as for example illuminating the n rows sequentially, one at any given time, by connecting the n rows to a single coupling light source via a 1×n optical switch. The single detector output can then be used for unambiguously determine the probe light intensities coming from 100 locations by lock-in demodulation at m=10 distinct column frequencies for n=10 distinct time intervals selecting the rows (s11). Other encoding schemes can be used such as Hadamard codes or double-lock-in detection with modulating both probe and coupling beams, as well as other encoding and decoding schemes.

The following are incorporated by reference herein in their entirety: Kim et al., "Photonic waveguide to free-space Gaussian beam extreme mode converter", Light: Science & Applications 7, 72 (2018); Hummon et al., *Optica,* 5 (4), 443 (2018); U.S. Provisional Patent Application Ser. No. 62/975, 424; and U.S. patent application Ser. No. 16/816,047.

While one or more embodiments have been shown and described, modifications and substitutions may be made thereto without departing from the spirit and scope of the invention. Accordingly, it is to be understood that the present invention has been described by way of illustrations and not limitation. Embodiments herein can be used independently or can be combined.

All ranges disclosed herein are inclusive of the endpoints, and the endpoints are independently combinable with each other. The ranges are continuous and thus contain every value and subset thereof in the range. Unless otherwise stated or contextually inapplicable, all percentages, when expressing a quantity, are weight percentages. The suffix (s) as used herein is intended to include both the singular and the plural of the term that it modifies, thereby including at least one of that term (e.g., the colorant(s) includes at least one colorants). Option, optional, or optionally means that the subsequently described event or circumstance can or cannot occur, and that the description includes instances where the event occurs and instances where it does not. As used herein, combination is inclusive of blends, mixtures, alloys, reaction products, collection of elements, and the like.

As used herein, a combination thereof refers to a combination comprising at least one of the named constituents, components, compounds, or elements, optionally together with one or more of the same class of constituents, components, compounds, or elements.

All references are incorporated herein by reference.

The use of the terms "a," "an," and "the" and similar referents in the context of describing the invention (especially in the context of the following claims) are to be construed to cover both the singular and the plural, unless otherwise indicated herein or clearly contradicted by context. It can further be noted that the terms first, second, primary, secondary, and the like herein do not denote any order, quantity, or importance, but rather are used to distinguish one element from another. It will also be understood that, although the terms first, second, etc. are, in some instances, used herein to describe various elements, these elements should not be limited by these terms. For example, a first current could be termed a second current, and, similarly, a second current could be termed a first current, without departing from the scope of the various described embodiments. The first current and the second current are both currents, but they are not the same condition unless explicitly stated as such.

The modifier about used in connection with a quantity is inclusive of the stated value and has the meaning dictated by the context (e.g., it includes the degree of error associated with measurement of the particular quantity). The conjunction or is used to link objects of a list or alternatives and is not disjunctive; rather the elements can be used separately or can be combined together under appropriate circumstances.

What is claimed is:

1. A photonic Rydberg atom radio frequency receiver (200) for measuring a radio frequency electric field of a radio frequency field (5), the photonic Rydberg atom radio frequency receiver (200) comprising:
an integrated photonic chip (2);
at least one atomic vapor cell (1) hermetically disposed on the integrated photonic chip (2) and that receives an atomic vapor (13) and that comprises a cell wall (18) that bounds an interior vapor space (17), such that the atomic vapor (13) is disposed in the interior vapor space (17) and that:
receives probe laser light (6) from a photonic emitter (8) and coupling laser light (7), such that probe laser light (6) and a coupling laser light (7) overlappingly counter-propagate through the interior vapor space (17) in multiple locations in the interior vapor space (17); and
receives a radio frequency field (5) from a radiofrequency source (23), such that the atomic vapor (13) receives the radio frequency field (5) and responds by changing energy of quantum levels in response to the radio frequency field (5); and
at least one receiver member (9) comprising:
a photonic emitter (8) disposed on the integrated photonic chip (2) and in optical communication with the interior vapor space (17) of the atomic vapor cell (1) and that receives probe laser light (6) and communicates the probe laser light (6) to the interior vapor space (17);
a pair of probe light reflectors (19) disposed on the atomic vapor cell (1) such that the pair of probe light reflectors (19) is optically opposed across the interior vapor space (17) and receives and reflects the probe laser light (6) so that the probe laser light (6) is reflected between the probe light reflectors (19) multiple times in the interior vapor space (17); and
a pair of coupling light reflectors (20) disposed on the atomic vapor cell (1) such that the pair of coupling light reflectors (20) is optically opposed across the interior vapor space (17) and receives and reflects the coupling laser light (7) so that the coupling laser light (7) is reflected between the coupling light reflectors (20) multiple times in the interior vapor space (17),
such that the probe light reflectors and coupling light reflectors are arranged to provide a folded optical interaction path of the probe laser light and the coupling laser light in the atomic vapor cell.

2. The photonic Rydberg atom radio frequency receiver (200) of claim 1, further comprising a coupling laser integrator (3) disposed on the integrated photonic chip (2) and that receives the coupling laser light (7) and communicates the coupling laser light (7) to the interior vapor space (17).

3. The photonic Rydberg atom radio frequency receiver (200) of claim 1, further comprising a reference RF emitter (10) disposed on the atomic vapor cell (1) and that communicates a reference RF field (11) to the interior vapor space (17).

4. The photonic Rydberg atom radio frequency receiver (200) of claim 3, wherein the photonic Rydberg atom radio frequency receiver (200) is calibrated from the reference RF emitter (10).

5. The photonic Rydberg atom radio frequency receiver (200) of claim 1, further comprising a detector (4) in optical communication with the interior vapor space (17) and that receives the coupling laser light (7) exiting from the interior vapor space (17).

6. The photonic Rydberg atom radio frequency receiver (200) of claim 1, further comprising a radiofrequency source (23) in communication with the interior vapor space (17) and that communicates the radio frequency field (5) to the interior vapor space (17).

7. The photonic Rydberg atom radio frequency receiver (200) of claim 1, further comprising a probe light antireflector (21) disposed on the atomic vapor cell (1) and that is an antireflective coating for the wavelength of the probe laser light (6).

8. The photonic Rydberg atom radio frequency receiver (200) of claim 1, further comprising a coupling light antireflector (22) disposed on the atomic vapor cell (1) and that is an antireflective coating for the wavelength of the coupling laser light (7).

9. The photonic Rydberg atom radio frequency receiver (200) of claim 1, wherein the probe laser light (6) and coupling laser light (7) interrogate the Rydberg state of the atomic vapor (13), such that the atomic vapor (13) is transparent to the probe laser light (6) in an absence of the radio frequency field (5) through the atomic vapor (13) in the interior vapor space (17).

10. The photonic Rydberg atom radio frequency receiver (200) of claim 1, wherein the photonic Rydberg atom radio frequency receiver (200) comprises a plurality of the receiver members (9).

11. The photonic Rydberg atom radio frequency receiver (200) of claim 10, wherein the receiver members (9) are arranged in an array.

12. The photonic Rydberg atom radio frequency receiver (200) of claim 11, wherein the array is a linear array disposed laterally along the atomic vapor cell (1).

13. The photonic Rydberg atom radio frequency receiver (200) of claim 11, wherein the array is a two-dimensional array disposed laterally along the atomic vapor cell (1).

14. The photonic Rydberg atom radio frequency receiver (200) of claim 13, wherein, in the two-dimensional array, the receiver members (9) are arranged in rows and columns along the atomic vapor cell (1).

15. The photonic Rydberg atom radio frequency receiver (200) of claim 1, wherein the photonic Rydberg atom radio frequency receiver (200) comprises a plurality of the atomic vapor cells (1) and a plurality of the receiver members (9), such that and each atomic vapor cell (1) is optically interrogated by at least one receiver member (9).

16. The photonic Rydberg atom radio frequency receiver (200) of claim 1, further comprising a multiplexed detection system that receives the probe laser light (6) that exits from the interior vapor space (17), wherein the amount of the probe laser light (6) that exits from the interior vapor space (17) depends on the radio frequency electric field of the radio frequency field (5) interacting with the Rydberg atoms in the interior vapor space (17); and that determines the radio frequency electric field of the radio frequency field (5) at multiple spatial locations of the photonic Rydberg atom radio frequency receiver (200) from the probe laser light (6) that exits from the interior vapor space (17).

17. A process for measuring a radio frequency electric field of a radio frequency field (5) with a photonic Rydberg atom radio frequency receiver (200), the process comprising:

performing the process with the photonic Rydberg atom radio frequency receiver (200) that comprises:
an integrated photonic chip (2);
at least one atomic vapor cell (1) hermetically disposed on the integrated photonic chip (2) in which is disposed an atomic vapor (13) and that comprises a cell wall (18) that bounds an interior vapor space (17), such that the atomic vapor (13) is disposed in the interior vapor space (17); and
at least one receiver member (9) comprising:
a photonic emitter (8) disposed on the integrated photonic chip (2) and in optical communication with the interior vapor space (17) of the atomic vapor cell (1);
a pair of probe light reflectors (19) disposed on the atomic vapor cell (1) such that the pair of probe light reflectors (19) is optically opposed across the interior vapor space (17); and
a pair of coupling light reflectors (20) disposed on the atomic vapor cell (1) such that the pair of coupling light reflectors (20) is optically opposed across the interior vapor space (17),
such that the probe light reflectors and coupling light reflectors are arranged to provide a folded optical interaction path of the probe laser light and the coupling laser light in the atomic vapor cell;
receiving, by the photonic emitter (8), probe laser light (6) and communicating the probe laser light (6) from the photonic emitter (8) to the interior vapor space (17);
receiving and reflecting, by the pair of probe light reflectors (19), the probe laser light (6) so that the probe laser light (6) is reflected between the probe light reflectors (19) multiple times in the interior vapor space (17);
receiving and reflecting, by the by the pair of coupling light reflectors (20), the coupling laser light (7) so that the coupling laser light (7) is reflected between the coupling light reflectors (20) multiple times in the interior vapor space (17);
receiving, by the interior vapor space (17) of the atomic vapor cell (1), the probe laser light (6) from the photonic emitter (8) and the coupling laser light (7);
overlappingly counter-propagating the probe laser light (6) and the coupling laser light (7) through the interior vapor space (17) in multiple locations in the interior vapor space (17) due to being reflected respectively between the probe light reflectors (19) and the coupling light reflectors (20) multiple times in the interior vapor space (17);
producing Rydberg atoms from the atomic vapor (13) in the interior vapor space (17) in a first quantum state in an absence of the radio frequency field (5);
receiving, by the interior vapor space (17), the radio frequency field (5) from a radiofrequency source (23), such that the atomic vapor (13) receives the radio frequency field (5);
changing the energy of the first quantum state of the Rydberg atoms in the atomic vapor (13) in response to the atomic vapor (13) receiving the radio frequency field (5); and
communicating the probe laser light (6) from the interior vapor space (17), wherein the amount of the probe laser light (6) that exits from the interior vapor space (17) depends on the radio frequency electric field of the radio frequency field (5) interacting with the Rydberg atoms in the interior vapor space (17).

18. The process for measuring a radio frequency electric field of claim 17; further comprising determining the radio frequency electric field of the radio frequency field (5) at multiple spatial locations of the photonic Rydberg atom radio frequency receiver (200) from the probe laser light (6) that exits from the interior vapor space (17).

\* \* \* \* \*